United States Patent [19]
Okuhira et al.

[11] Patent Number: 5,401,357
[45] Date of Patent: Mar. 28, 1995

[54] DRY ETCHING METHOD

[75] Inventors: Hidekazu Okuhira, Hachioji; Tetsuo Ono; Susumu Hiraoka, both of Kokubunji; Keizo Suzuki, Kodaira; Junji Shigeta, Fuchu; Hiroshi Masuda, Hachioji; Mitsuhiro Mori, Ibaragi; Takuma Tanimoto, Kokubunji; Shinichi Nakatsuka, Hino; Katsuhiko Mitani, Kodaira, all of Japan

[73] Assignee: Hitachi Ltd., Tokyo, Japan

[21] Appl. No.: 937,781

[22] Filed: Sep. 1, 1992

[30] Foreign Application Priority Data

Sep. 19, 1991 [JP] Japan ................................. 3-239242

[51] Int. Cl.⁶ ..................... H01L 21/3065; B44C 1/22
[52] U.S. Cl. ................... 156/643; 156/628; 156/655; 156/659.1; 156/662; 156/345; 437/234
[58] Field of Search ............... 156/643, 646, 654, 628, 156/649, 655, 656, 662, 659.1, 345; 437/133, 189, 190, 234; 204/192.32; 252/79.1

[56] References Cited

U.S. PATENT DOCUMENTS

| | | | |
|---|---|---|---|
| 4,648,938 | 3/1987 | Ashby et al. | 156/643 |
| 4,678,536 | 7/1987 | Murayama et al. | 156/345 X |
| 4,880,493 | 11/1989 | Ashby et al. | 437/234 X |
| 5,092,957 | 3/1992 | Ashby et al. | 437/234 X |

FOREIGN PATENT DOCUMENTS 0204538 12/1986 European Pat. Off. .
0374036 6/1990 European Pat. Off. .

OTHER PUBLICATIONS

Ehrlich, Laser-induced microscopic etching of GaAs and InP, Appl. Phys. Lett. 36(8), 15 Apr. 1980, pp. 698-700.

Hikosaka, Kohki; Mimura, Takashi and Joshin, Kazukiyo, "Selective Dry Etching of AlGaAs-GaAs Heterojunction", Japanese Journal of Applied Physics, vol. 20, No. 11, Nov. 1981, pp. L847-L850.

IBM Technical Disclosure Bulletin, vol. 23, No. 3, Aug. 1980, R. T. Hodgson: *Method of Etching Undoped Regions of a Substrate Without Masking.*

IEEE Electron Device Letters, vol. 13, No. 2, Feb. 1992, New York, US, pp. 105-107; Kuroda et al.: *Highly Uniform N-InAlAs/InGaAs HEMT's on a 3-in InP Substrate Using Photochemical Selective Dry Recess Etching.*

Electronics Letters, vol. 27, No. 23, 7 Nov. 1991, Enage, GB, pp. 2113-2115; Kosugi et al.: *Selective Photochemical Dry Etching of GaAs/AlGaAs and InGaAs/InAlAs Heterostructures.*

*Primary Examiner*—William A. Powell
*Attorney, Agent, or Firm*—Kenyon & Kenyon

[57] ABSTRACT

A method may be used to dry etch a sample including a plurality of regions different from each other in the photo-absorption of a light having a specified wavelength using an etching gas plasma. The method is capable of selectively etching the desired material from a plurality of materials having different types of band gap energies or from a plurality of materials having different band gap energies. The method includes a step of irradiating a light having the specified wavelength on the sample for reducing an etching rate of a region having a large photo-absorption coefficient to the light, thereby selectively etching a region having a small photo-absorption coefficient to the light.

20 Claims, 11 Drawing Sheets

DRY ETCHING METHOD

BACKGROUND OF THE INVENTION

The present invention relates to a dry etching method, and particularly, to a dry etching method capable of selectively etching the desired material from a plurality of materials having different types of band gap energies or from a plurality of materials having different band gap energies.

The technique of selectively etching the desired material from a plurality of semiconductors having different compositions is very important in fabrication of a compound semiconductor device. For example, in fabrication of a semiconductor device having a heterostructure of GaAs and $Al_xGa_{1-x}As$, $Al_xGa_{1-x}As$ is selectively etched by wet etching and GaAs is selectively etched by dry etching.

The selective wet etching of $Al_xGa_{1-x}As$ is conducted using an etchant of $HCl/H_2O_2$ or $NH_3/H_2O_2/H_2O$. This is utilized in fabrication of a laser diode, HBT(Hetero-Bipolar Transistor) and the like. However, as is well known, the wet etching has such a problem as causing an under-cut and is thus unsuitable for fine patterning.

Meanwhile, a technique of selectively wet etching GaAs has not yet been found.

Japanese Journal of Applied physics Vol. 20, No. 11, pp. L847–L850 discloses that the selective dry etching of GaAs is possible by RIE (Reactive Ion Etching) using an etching gas of $CCl_2F_2$. This depends on a non-volatile $AlF_3$ formed on the surface of $Al_xGa_{1-x}As$ during etching. The non-volatile $AlF_3$ obstructs the etching reaction, thereby reducing the etching rate of the $Al_xGa_{1-x}As$. Meanwhile, such a thin film is not formed on the surface of GaAs, and thereby the etching rate of GaAs is relatively increased. However, it has not been realized to selectively dry etching only $Al_xGa_{1-x}As$ without etching GaAs.

As mentioned above, to selectively etch GaAs and $Al_xGa_{1-x}As$, both the dry and wet etching techniques must be combined. However, since the wet etching is unsuitable for fine patterning, it is desired to selectively etch GaAs and $Al_xGa_{1-x}As$ by only dry etching.

SUMMARY OF THE INVENTION

To solve the above problem, the present invention has been made, and the object is to provide a method for selectively etching $Al_xGa_{1-x}As$ to GaAs.

To achieve the above object, according to the present invention, there is provided a method for selectively etching $Al_xGa_{1-x}As$ to GaAs by irradiating a light on a sample to be etched for changing an etching rate ratio between $Al_xGa_{1-x}As$ and GaAs.

The present invention has realized the selective etching of $Al_xGa_{1-x}As$ to GaAs, for example, by utilizing the difference in a photo-absorbing characteristic between $Al_xGa_{1-x}As$ and GaAs. GaAs is a direct transfer semiconductor [band gap energy Eg (GaAs)=1.43 eV] and absorbs a light having a photon energy of 1.43 eV or more (wavelength: 867 nm or less). Meanwhile, $Al_xGa_{1-x}As$ is variable in the transition type and the band gap energy Eg ($Al_xGa_{1-x}As$) depending on the composition (x). FIG. 15 shows a relationship between the composition and the band gap energy. In general, the relationship between the Eg ($Al_xGa_{1-x}As$) and Eg (GaAs) is represented as follows:

$$Eg(GaAs) < Eg(Al_xGa_{1-x}As) \quad (1)$$

Accordingly, when the wavelength $\lambda p$ of the irradiated light is selected to satisfy the following equation (2), it is possible to induce a photo-reaction accompanied by the photo-absorption of a substrate on only the surface of GaAs.

$$\frac{hc}{Eg(GaAs)} > \lambda p > \frac{hc}{Eg(Al_xGa_{1-x}As)} \quad (2)$$

wherein (h) is a Planck's constant, (c) is the light velocity in vacuum. Also, even for the light having the wavelength specified in the equation (3), since GaAs has the absorption end on the longer wavelength side as compared with $Al_xGa_{1-x}As$, a photo-absorption coefficient $\alpha$ satisfies the equation (4).

$$\lambda p < \frac{hc}{Eg(Al_xGa_{1-x}As)} \quad (3)$$

$$\alpha(GaAs) > \alpha(Al_xGa_{1-x}As) \quad (4)$$

Accordingly, the light having such a wavelength as satisfying the equation (5) can induce the strong photo-reaction on the surface of GaAs.

$$\frac{hc}{Eg(GaAs)} > \lambda p \quad (5)$$

In the present invention, the following three different photo-reactions are utilized:
(a) photo-CVD reaction
(b) photo-oxidation reaction
(c) photo-stimulated desorption Hereinafter, there will be explained how the selective etching is realized by utilizing each of the above three photo-reactions.

(a) photo-CVD reaction

In forming GaAs film on GaAs substrate, it is possible to promote the film forming reaction through the photo-absorption by a substrate. The reason for this is that electrons and positive holes photo-excited on the surface of GaAs react with a source gas molecules absorbed on the surface of GaAs. Meanwhile, since $Al_xGa_{1-x}As$ has a small photo-absorption coefficient as compared with GaAs, the film formation by the photo-absorption of the substrate is retarded as compared with GaAs.

Accordingly, for example, in dry etching a sample including an $Al_xGa_{1-x}As$ 1 and a GaAs 2 as shown in FIG. 1a, besides an etching gas, a source gas for forming GaAs is introduced into an etching chamber, and a light 4 having such a wavelength as satisfying the above equation (2), that is, capable of being absorbed by only GaAs is irradiated on the sample. Consequently, the etching rate is retarded on the surface of the GaAs 2 because the etching reaction and the film formation due to the photo-CVD reaction of GaAs are competed with each other. Meanwhile, only the etching reaction is progressed on the surface of the $Al_xGa_{1-x}As$ 1. Accordingly, the $Al_xGa_{1-x}As$ 1 is selectively etched as shown in FIG. 1b, and the etching rate of GaAs is significantly small. In addition, in FIG. 1b, the portion 5 of GaAs formed by the photo-CVD reaction is emphasized. In the practical etching, various conditions are adjusted such that the photo-CVD reaction and the etching reaction of GaAs are cancelled to each other so as to generate the least possible film formation and the etching.

In addition, when a RF discharge such as RIE (Reactive Ion Etching) is utilized for dry etching, there occurs decomposition of the source gas molecules of GaAs thereby forming a GaAs film on the whole substrate. Further, on the GaAs, the GaAs forming reaction by the photo-reaction of the substrate is added, so that a GaAs film is made thicker than $Al_xGa_{1-x}As$. Therefore, the selective etching of $Al_xGa_{1-x}As$ is possible by increasing the whole etching rate.

In utilizing the photo-CVD reaction, a light as satisfying the above equation (3), that is, capable of being absorbed by $Al_xGa_{1-x}As$ may be used as an irradiated light. The reason for this is that, even in the light having such a wavelength, the photo-absorption coefficient of GaAs is larger than $Al_xGa_{1-x}As$.

(b) photo-oxidation reaction

The etching reaction tends to be obstructed and retarded by an oxide film formed on the surface of a sample. In GaAs, by irradiation of the light having a photon energy higher than the band gap energy, the sticking coefficient of $O_2$ is made larger several times. This is seemed to be related to the carriers generated on the GaAs surface. The oxide film equivalent to one molecular layer is formed on the GaAs surface.

Accordingly, for example, in the dry etching of the sample including an $Al_xGa_{1-x}As$ 1 and a GaAs 2 as shown in FIG. 1a, oxygen other than the etching gas is introduced in the etching chamber, and the etching is conducted by irradiating the light having the wavelength satisfying the equation (2), that is, capable of being absorbed by only GaAs, so that the surface of the GaAs 1 is covered with a thin oxide film for obstructing the etching reaction, resulting in the retarded etching rate. Meanwhile, on the surface of the $Al_xGa_{1-x}As$ 1, only the etching reaction is progressed. Therefore, as shown in FIG. 1b, the selective etching of the $Al_xGa_{1-x}As$ 1 is possible to the GaAs 2.

In addition, in utilizing the photo-oxidation reaction, there must be carefully used the light having the wavelength satisfying the equation (3). This is because the oxide of Al is low in its vapor pressure as compared with the oxide of Ga which may significantly obstruct the etching reaction of the $Al_xGa_{1-x}As$. Accordingly, in using the light having the wavelength satisfying the equation (3), it is desired to select the light of the longer wavelength.

(c) photo-stimulated desorption

The photo-stimulated desorption is induced by a thermal mechanism by heating of the substrate, and an electronic mechanism by the electronic kinetics through excitation of electronic state of the absorbing material or the substrate. In the present invention, the electronic kinetics through excitation of electronic state of the substrate is related. In this mechanism, the electrons excited to the empty level above the Fermi energy are elastically tunneled to the empty level of the absorbed gas molecules, which promotes the stimulated desorption of the absorbed molecules. Accordingly, when the etching gas is absorbed and is reacted with the surface, by promotion of the stimulated desorption being reversed to the absorption, the absorbed gas can be desorbed before being reacted with the substrate, resulting in the retarded etching reaction.

Accordingly, in the dry etching of the sample including an $Al_xGa_{1-x}As$ 1 and a GaAs 2 as shown in FIG. 1a, when the light capable of being absorbed by only GaAs is irradiated, the stimulated desorption of the absorbed etching gas is promoted on the GaAs surface thereby reducing the etching rate, which enables the selective etching of $Al_xGa_{1-x}As$ to GaAs. In the case that the chemical reaction mainly dominates the dry etching, the utilization of the photo-stimulated desorption is particularly effective.

In utilizing the photo-stimulated desorption, similarly to the case of utilizing the photo-CVD reaction, a light satisfying the equation (3), that is, capable of being absorbed by $Al_xGa_{1-x}As$ may be used as the irradiated light. This is because, even in the light having such a wavelength, the photo-absorption coefficient of GaAs is larger than $Al_xGa_{1-x}As$.

As mentioned above, while the present invention has been explained regarding the selective etching of $Al_xGa_{1-x}As$ to GaAs, it is applicable for the whole selective etching of the material having the smaller photo-absorption among the materials having different photo-absorption characteristics. Concretely, in the presence of a plurality of materials having different types of band gap energies, it is possible to selectively etch only the indirect transition material. Also, it is possible to selectively etch only the material having a broad band gap energy among a plurality of materials having different band gap energies. The types of band gap energies for the main semiconductors are shown in Table 1. By suitable combination of the materials as shown in Table 1, the selective etching is possible by easily applying the present invention.

TABLE 1

| | | |
|---|---|---|
| IV-group | Si | indirect |
| | Ge | indirect |
| | Sic | indirect |
| VI-group | Se | direct |
| | Te | direct |
| III-V group | BiP | indirect |
| | AlP | indirect |
| | AlAs | indirect |
| | AlSb | indirect |
| | GaN | direct |
| | GaP | indirect |
| | GaAs | direct |
| | GaSb | direct |
| | InP | direct |
| | InAs | direct |
| | InSb | direct |
| II-VI group | ZnO | direct |
| | ZnS | direct |
| | ZnSe | direct |
| | ZnTe | direct |
| | Cds | direct |
| | CdSe | direct |
| | CdTe | direct |
| | HgSe | direct |
| | HgTe | direct |
| IV-IV group | Pbs | direct |
| | PbSe | direct |
| | PbTe | direct |
| | SnTe | direct |
| III-VI group | GaSe | indirect |

By using the present invention, in a sample having an composition continuously variable in the thickness direction, that is, a graded composition, the etching can be stopped at the depth having the specified composition. For example, in the case of the $Al_xGa_{1-x}As$, the band gap energy of the direct transition is represented in the following equation (6) as a function Eg(x)[eV] of the composition (x) of Al.

$$Eg(x) = 1.439 + 1.042x + 0.468x^2 \tag{6}$$

In a sample having the composition (x) graded down in the thickness direction, as the etching is progressed, the value of Eg on the surface of the sample becomes smaller gradually. When the etching is desired to be stopped at the depth having the composition $x_o$, the etching may be conducted while irradiating the light having a wavelength $\lambda_o$ represented in the equation (7) on the sample.

$$\lambda_0 = \frac{h_c}{Eg(Al_{x_0}Ga_{1-x_0}As)} \quad (7)$$

Thus, while the light of the wavelength of $\lambda_o$ is not absorbed by $Al_xGa_{1-x}As$ at first, the value of Eg on the surface of the sample becomes smaller with progress of the etching, and at the desired composition, the photo-absorption is started and the etching is stopped.

DETAILED DESCRIPTION OF THE PREFERRED EMBODIMENTS

<Example 1>

In this Example, the photo-CVD reaction is utilized. In RIE (Reactive Ion Etching) using an etching gas of ($CCl_4$+He), TMGa (Ga $(CH_3)_3$ trimethylgallium)-+$AsH_3$s(arsine) are used as a source gas for forming GaAs, and a low pressure mercury lamp is used as a light source of photo-CVD.

Figure 2:
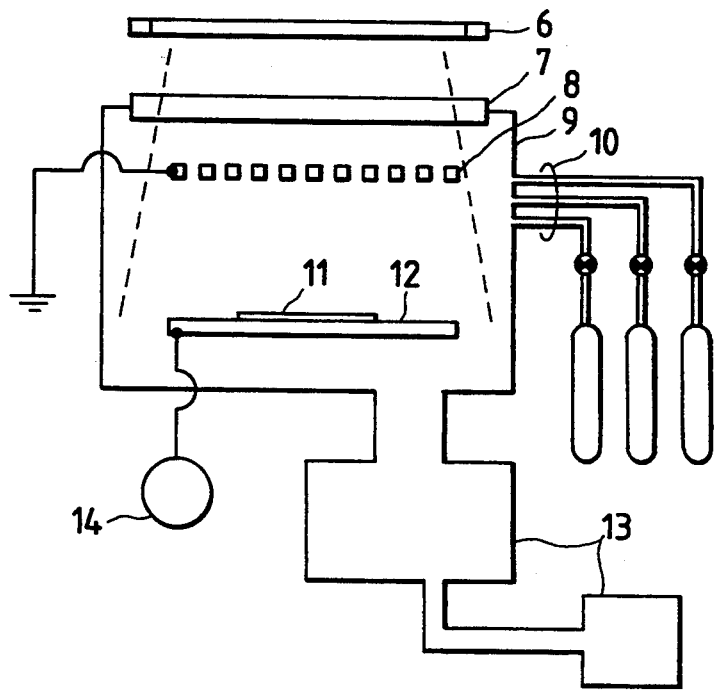
FIG. 2 is a view showing an etching equipment used in Example 1 of the present invention.

An equipment used in this Example is shown in FIG. 2. In this equipment, the ground electrode of the conventional RIE equipment is replaced into a meshly ground electrode 8, and a light from a low pressure mercury lamp 6 can be irradiated to a sample 11 through a fused quartz window 7. The low pressure mercury lamp 6 emits an ultra-violet light having a wavelength of 185 nm and 245 nm. It is sufficiently shorter than the wavelength of the photon corresponding to the energy of the band gap energy of GaAs or $Al_xGa_{1-x}As$. However, the absorption coefficient of GaAs is seemed to be remarkably larger than $Al_xGa_{1-x}As$.

Figure 1A:
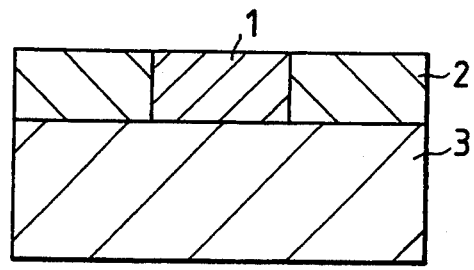
FIGS. 1a and 1b are views for explaining the principle of the present invention.

As shown in FIG. 1a, the sample 11 is prepared by forming two regions of an $Al_xGa_{1-x}As$ 1 (x=0.4) and a GaAs 2 each having a thickness of 150 nm on a GaAs substrate 3. The sample 11 is placed in an etching chamber 9, and the etching chamber 9 is then exhausted at 0.001 m Torr or less by a pumping system 13. Subsequently, an etching gas of $CCl_4$ (at 40 Δm Torr)+He (at 50 Δm Torr), and a source gas of TMGa (at 80 Δm Torr)+$sH_3$ (at 40 Δm Torr) for forming GaAs are introduced from a gas supply system 10.

Figure 1B:
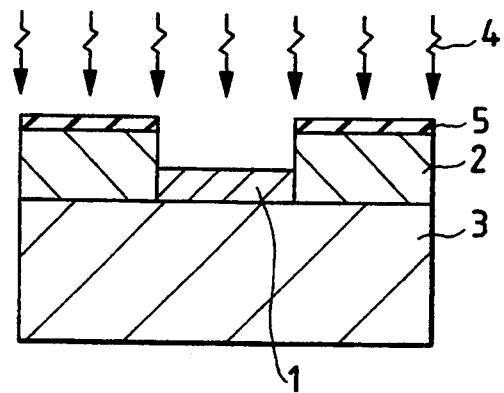

The low pressure mercury lamp 9 is lightened, and the gas in the etching chamber is discharged by a RF power supply 14. Consequently, as shown in FIG. 1b, only the $Al_xGa_{1-x}As$ 1 is etched to a thickness of approximately 100 nm, and the etching of the GaAs 2 is not recognized.

In this Example, there occurs decomposition of the source gas molecules for forming GaAs even in vapor phase by the RF discharge, and thus a thin GaAs film is formed on the whole surface of the substrate. Further, the GaAs forming reaction through the light absorbed by the substrate is added thereto on the GaAs 2, so that the thickness of the GaAs film formed on the GaAs 2 is made thicker than the $Al_xGa_{1-x}As$ 1. Therefore, the etching reaction is not progressed on the GaAs 2 because the GaAs forming reaction is balanced to the etching reaction. Meanwhile, the etching reaction is predominant on the $Al_xGa_{1-x}As$ 1, and accordingly, the $Al_xGa_{1-x}As$ 1 is selectively etched.

In this Example, the etching of the $Al_xGa_{1-x}As$ is conducted using the RIE. The RIE is an etching technique excellent in anisotropy and suitable for fine patterning. As shown in this Example, the selective etching utilizing the photo-CVD reaction is recognized to be effective to the RIE.

<Example 2>

In this Example, the photo-oxidation reaction is utilized. In the photo-etching by a XeF excimer laser using an etching gas of $Cl_2$, oxygen is used as an oxidation gas. Since the $Cl_2$ molecule has an absorption peak near the wavelength of 340 nm, the XeF excimer laser having the wavelength of 351 or 353 nm is suitable for excitation of $Cl_2$. An Ar ion laser having the oscillating wavelength of 514.5 nm is used for excitation of the photo-reaction on the GaAs surface.

Figure 4:
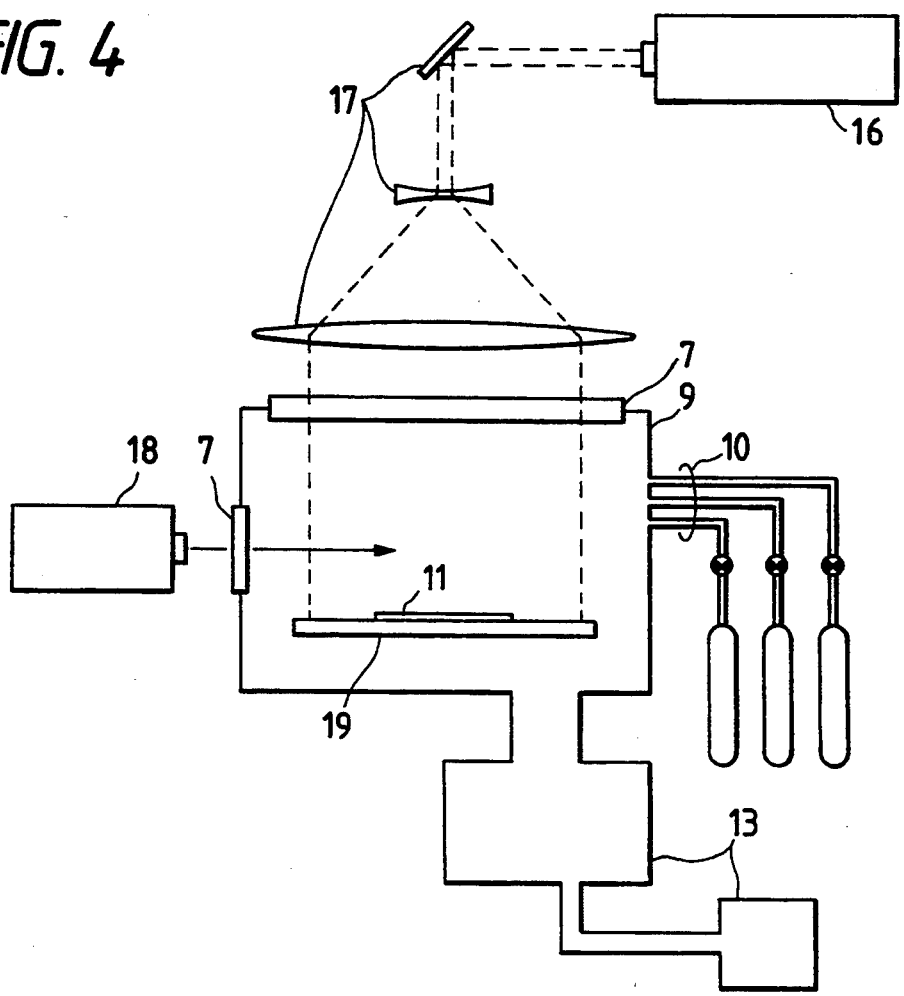
FIG. 4 is a view showing an etching equipment used in Example 2 of the present invention.

The brief construction of an equipment used in this Example is shown in FIG. 4. In this equipment, a laser beam from a XeF excimer 18 is made to horizontally pass over a sample 11 through a fused quartz window 7 for exciting the $Cl_2$ molecules in a gas phase. Meanwhile, a light from an Ar ion laser 16 is enlarged by an optical system 17, and is vertically irradiated on the sample 11.

Figure 3A:
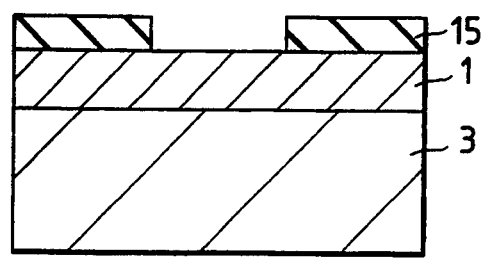
FIGS. 3a and 3b are views showing Example 2 of the present invention.

As shown in FIG. 3a, the sample 11 is obtained by growing an $Al_xGa_{1-x}As$ film 1 to a thickness of 150 nm on a GaAs substrate 3, and further forming the pattern of a resist film 15 thereon. The wavelength corresponding to the band gap energy 2.48 eV of the direct transition of $Al_xGa_{1-x}As$ is 500 nm, and accordingly, the light of the Ar ion laser is not absorbed by $Al_xGa_{1-x}As$ as compared with GaAs.

Figure 3B:
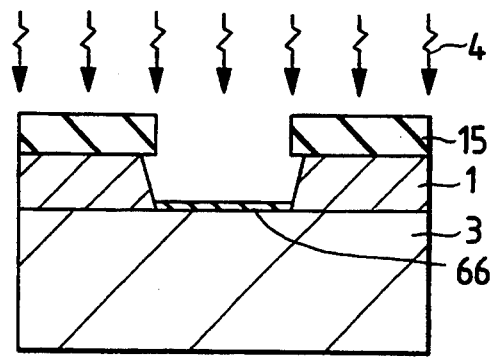

The etching is conducted in the following manner: The sample 11 is placed in an etching chamber 9, and the etching chamber 9 is then exhausted at 0.001 m Torr or less by a pumping system 13. Subsequently, $Cl_2$ (at 10 Δm Torr) and oxygen (at 100 Δm Torr) are introduced in the etching chamber 9 by a gas supply system 10. Lights from the Ar ion laser 16 and the XeF excimer laser 18 are irradiated for 30 min. Consequently, as shown in FIG. 3b, an $Al_xGa_{1-x}As$ film 1 is etched up to the surface of the GaAs substrate 2 according to the pattern of the resist 15. Also, even if the (laser) irradiation is further progressed, the GaAs substrate 2 is little etched.

In this Example, the photo-etching reaction of $Al_xGa_{1-x}As$ is progressed by the $Cl_2$ photo-excited in the vapor phase, and at the time when the etching reaches the surface of the GaAs substrate 3, the photo-oxidation reaction is generated through the photo-absorption by GaAs, thus forming an oxide film 66 on the surface of the GaAs substrate 3, which obstructs the progress of the etching.

In this Example, the etching of the $Al_xGa_{1-x}As$ is conducted using the photo-etching. This is expected as an effective etching technique because of eliminating the possibility of the damage generated by charged particles and high energy particles in the plasma etching. As shown in this Example, the selective etching technique utilizing the photo-oxidation reaction is recognized to be effective to the photo-etching.

For a sample having a composition (x) of $0.3 < x < 0.75$ thereby causing the photo-absorption of the Ar ion laser, it is possible to selectively etch the $Al_xGa_{1-x}As$ in the same procedure as in this Example.

<Example 3>

In this Example, the above photo-stimulated desorption is utilized. In the etching using the so-called hot molecular beam (the oscillating state of $Cl_2$ molecules is excited), a light of a low pressure mercury lamp is irradiated.

Figure 5:
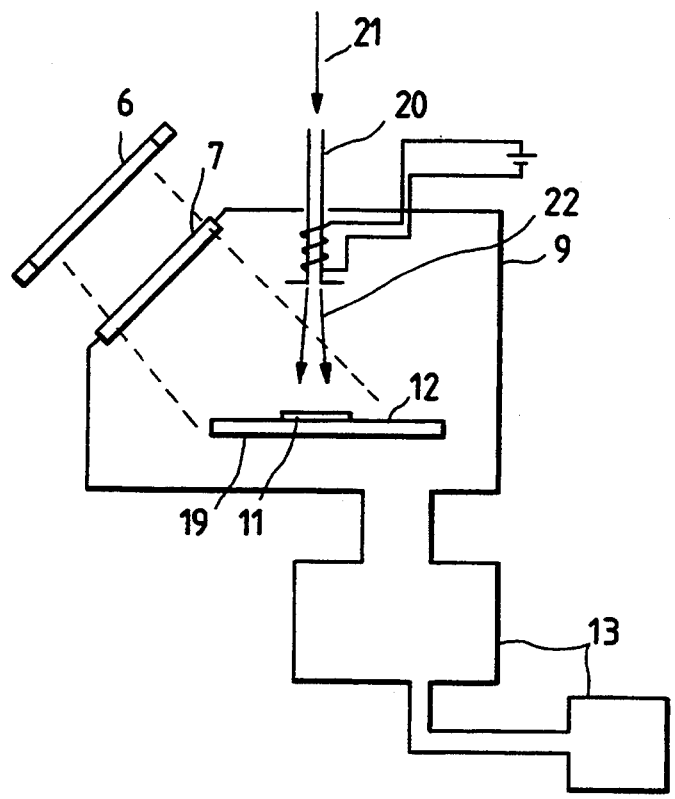
FIG. 5 is an etching equipment used in Example 3 of the present invention.

The brief construction of an equipment used in this Example is shown in FIG. 5. In this equipment, a hot molecular beam generating nozzle 20 is positioned over a sample 11 placed on a substrate holder 19. A $Cl_2$ hot molecular beam 22 is vertically irradiated on the sample 11. Also, the light from a low pressure mercury lamp 6 is irradiated obliquely on the sample 11 through a fused quartz window 7.

As shown in FIG. 1a, similarly to Example 1, a sample 11 used in this Example is obtained by forming $Al_xGa_{1-x}As$ 1 (x=0.4) and GaAs 2 regions on a GaAs substrate 3 to a thickness of 1.5 Δm. The sample 11 is placed in an etching chamber 9, and the etching chamber 9 is exhausted at 0.001 Δm Torr or less. At the specified pressure, the nozzle portion of the hot molecular beam generator 20 is heated at 800° C., and a $Cl_2$ gas 21 is supplied at an amount of 10 sccm and the $Cl_2$ hot molecular beam 22 is irradiated on the sample 11. At the same time, a low pressure mercury lamp 6 is lightened. This state is kept for 30 min. and the etching is conducted, and thus only the $Al_xGa_{1-x}As$ 1 is etched to a thickness of approximately 100 nm as shown in FIG. 1b.

In this Example, the etching of the $Al_xGa_{1-x}As$ is conducted using a hot molecular beam. This is expected as an effective etching technique because of eliminating the possibility of the damage generated by charged particles and/or high energy particles in the plasma. As shown in this Example, the selective etching technique utilizing the photo-stimulated desorption is recognized to be effective to the molecular beam etching.

<Example 4>

In this Example, the present invention is applied for the selective etching of Si layer to a $Si_nGe_n$ (n: number of atomic layers) supper lattice layer.

Si or Ge is essentially an indirect semiconductor. However, when it is formed into a multi-structure per several atomic layers (super lattice structure), type of transistor is changed into a direct semiconductor. The photo-absorption coefficient of the super lattice structure is made larger as compared with that of the original indirect semiconductor. Therefore, it is possible to selectively etch only a Si layer or Ge layer to the super lattice layer according to the present invention.

Figure 6A:
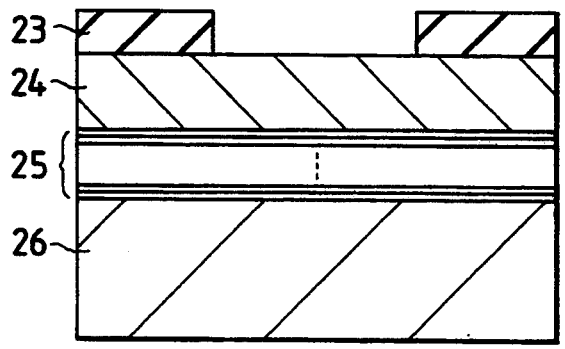
FIGS. 6a and 6b are views showing Example 4 of the present invention.
Figure 6B:
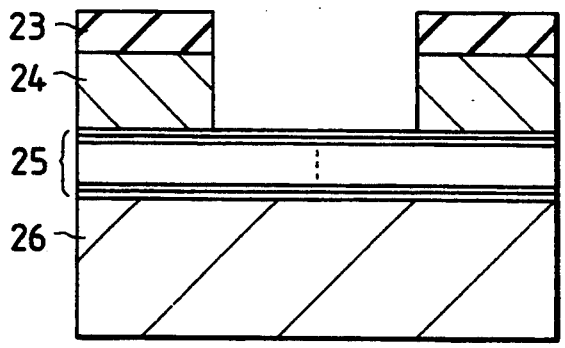

In this Example, an etching equipment as shown in FIG. 4 is used. Also, a sample 11 is obtained by 20 layers of $Si_4/Ge_4$ super lattice layers 25 and a Si layer 24 on a Si substrate 26 by MBE (Molecular Beam Epitaxy) as shown in FIG. 6. The sample 11 is formed with a mask pattern 23 on its surface by photolithography, and is then placed in an etching chamber 9. $Cl_2$ and $O_2$ are used as an etching gas and an oxidation gas, respectively. In the same procedure as in Example 2, exhaustion in the etching chamber 9, introduction of the etching gas and oxidation gas, and irradiation of the Ar ion laser beam and XeF excimer laser beam are conducted. Consequently, as shown in FIG. 6b, the etching is stopped at the Si layer of the outermost portion of the super lattice layer 25. The surface is examined by an Auger electron spectroscopy method, which shows oxidation of about two atomic layers of Si.

As mentioned above, it is recognized that the present invention is effective for fabrication of the semiconductor device having the $Si_nGe_n$ super lattice structure.

<Example 5>

In this Example, the present invention is applied for the selective etching of the $Al_xGa_{1-x}As$ emitter layer in a process of exposing a base layer in fabrication of HBT.

Figure 7A:
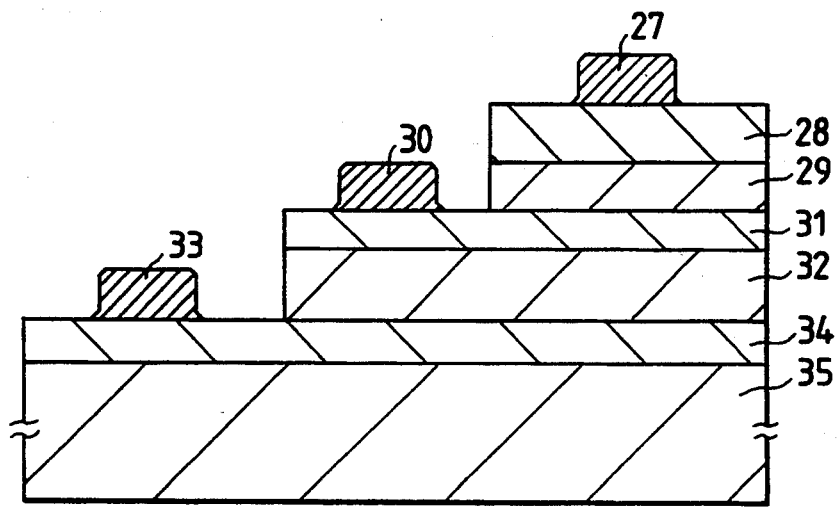
FIGS. 7a and 7b are views showing Example 5 of the present invention.
Figure 7B:
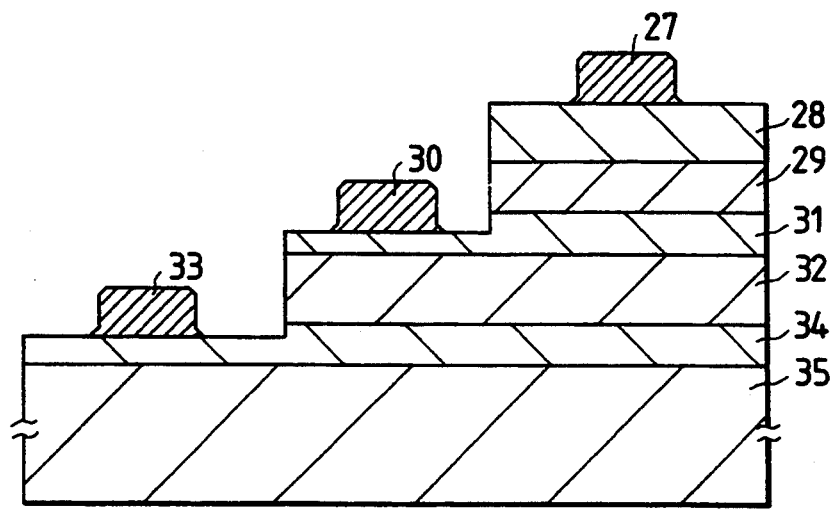

FIG. 7a shows a sectional structure of an ideal HBT. In a standard fabrication process, there are sequentially formed n+-GaAs (sub-collector) layer 34, n-GaAs (collector) layer 32, p+-GaAs (base) layer 31, n-$Al_xGa_{1-x}As$ (emitter) layer 29 and n+-GaAs (cap) layer 28 on a semi-insulated GaAs substrate 35. After that, the lithography and etching process are repeated for forming an emitter area, base electrode contact portion and a collector electrode contact portion, and finally an emitter electrode 27, base electrode 30 and collector electrode 33 are formed by a lift-off method. In a practical process, since the etching is not stopped accurately on the surfaces of the p+-GaAs (base) layer 31 and n+-GaAs (sub-collector) layer 34, the overetching is conducted as shown in FIG. 7b. In particular, there occurs such a problem that the p+-GaAs (base) layer 31 is made thinner which increases a base resistance. The maximum oscillating frequency $f_{max}$ of the HBT is proportional to the inverse number of the square root of the base resistance $R_b$ as shown in the equation (8).

$$f_{max} = \sqrt{\frac{f_t}{8\pi R_b C_{bc}}} \quad (8)$$

wherein $f_t$ is a gain cut-off frequency and $C_{bc}$ is a base collector capacity.

Accordingly, when the p+-GaAs (base) layer 31 is made thinner, the value of $f_{max}$ is reduced. The value of the $f_{max}$ is scattered depending on the scattering of the over-etching quantity. In consideration of the above, the present invention is applied for the etching of the n-$Al_xGa_{1-x}As$ (emitter) layer 29.

A wafer is obtained by forming each layer of HBT using a MBE equipment with an ultra-high vacuum, and then forming a resist mask on an emitter area by lithography. The wafer is placed in an etching chamber as shown in FIG. 2. The usual RIE is conducted using an etching gas of $CCl_2F_2$. In this etching, only the n+-GaAs (cap) layer 28 is etched, and thus the surface of n-$Al_xGa_{1-x}As$ As (emitter) layer 29 is exposed. Next, in the same condition as in Example 1, that is, the RIE is conducted using an etching gas of $CCl_4$ and a source gas of ($TMGa+AsH_3$), and a low pressure mercury lamp as a light source of the photo-CVD. Under this etching, only the n-$Al_xGa_{1-x}As$ (emitter) layer 29 is etched, and accordingly, the etching is stopped at the time when the surface of the p+-GaAs (base) layer 31 is just exposed. The wafer is taken-out and formed with a resist mask so as to expose a sub-collector area, after which the p+-GaAs (base) layer 31 and the n-GaAs (collector) layer 32 are etched by the RIE using the etching gas of $CCl_4$. Finally, an emitter electrode 27, base electrode 30 and collector electrode 33 are formed by a lift-off method.

The maximum oscillating frequency $f_{max}$ of the HBT in this Example is made higher (approximately 60 GHz) as compared with the conventional manner (30-50 GHz). Further, the scattering thereof is almost eliminated resulting in the improved characteristics.

<Example 6>

Figure 8A:
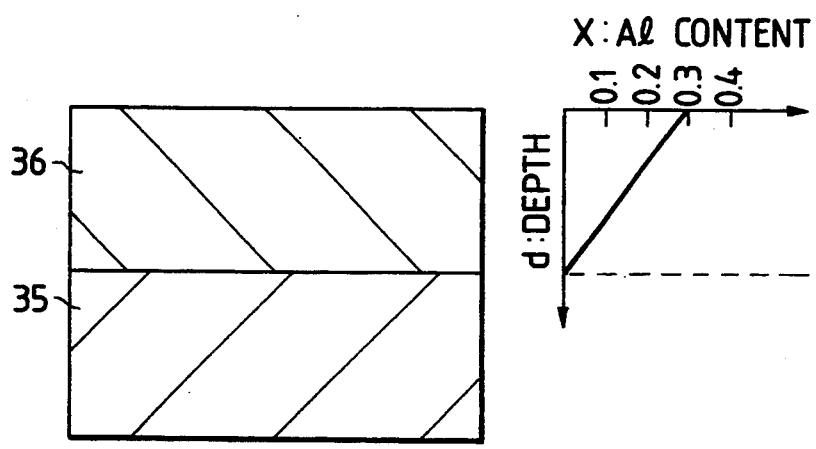
FIGS. 8a and 8b are views showing Example 6 of the present invention.

In this Example, using a sample of $Al_xGa_{1-x}As$ having a composition variable in the depth direction, the etching is stopped at the depth of the desired composition. The sample used in this Example is shown in FIG. 8a. The sample is obtained by forming an $Al_xGa_{1-x}As$ layer 36 having a graded composition to a thickness of 100 nm on a semi-insulated substrate 35 by a MBE method. The composition (x) is set to be 0.3 at the surface and 0.0 at the interface to coincide with the substrate, that is, GaAs. In order to stop the etching of this sample at the composition of x=0.15, the etching is conducted while irradiating a laser beam with a wavelength of 773 nm. This wavelength corresponds to the band gap energy of the composition (x) of the $Al_xGa_{1-x}As$ in the equation (7) and at the temperature of 300K.

Figure 9:
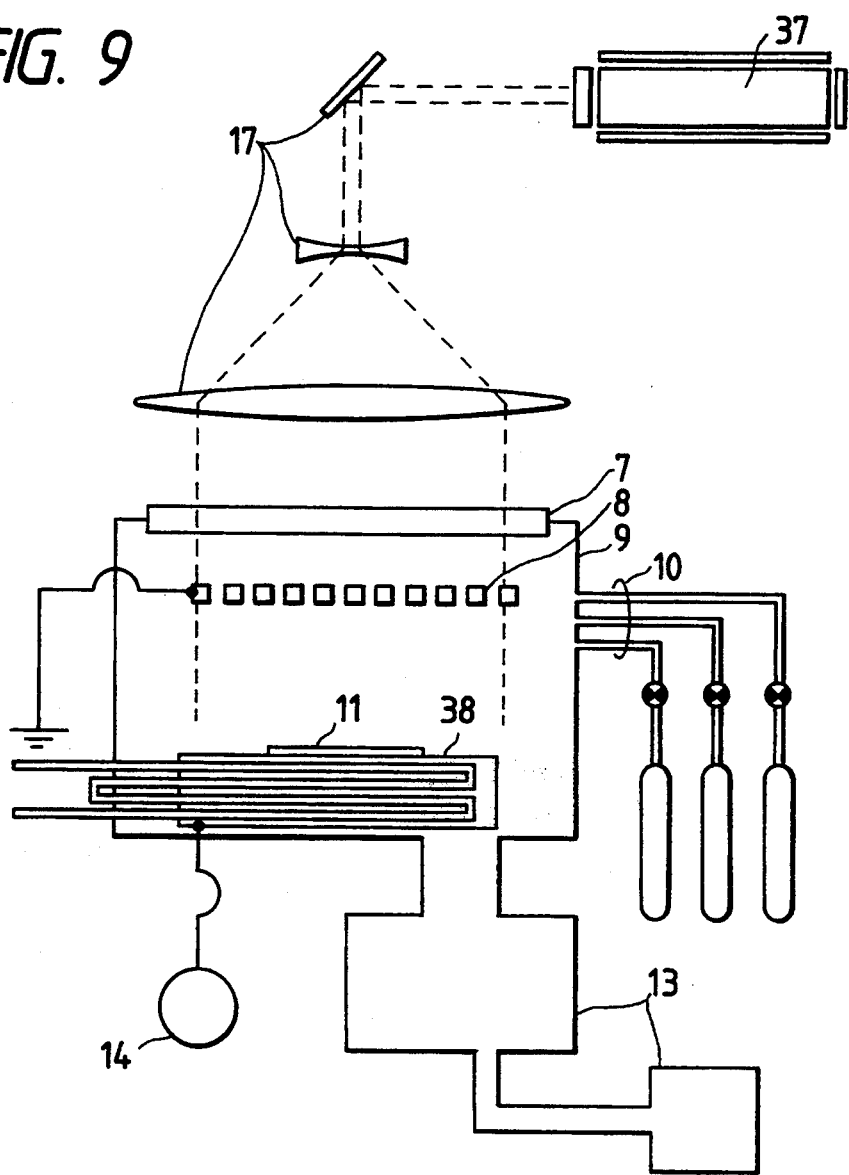
FIG. 9 is a view showing an etching equipment used in Example 6 of the present invention.

An etching equipment used in this Example is shown in FIG. 9. The characteristics of this etching equipment are as follows:

(1) to use a solid-state tunable laser as a light source for inducing the photo-CVD reaction
(2) to include a mechanism for holding a substrate temperature at constant Specifically, as the light source for inducing the photo-CVD reaction, there is used a solid-state tunable laser 37 having a laser crystal of Alexandrite ($BeAl_2O_4$) and a pumping of a mercury arc lamp. Further, there is used a RF electrode 38 having a heater and a water-cooling mechanism. To stop the etching at the specified composition, it is required to irradiate the light having a wavelength accurately corresponding to the band gap energy at the composition. Also, since the band gap energy is changed depending to the temperature, it also becomes important to keep the substrate temperature at constant.

The sample 11 is placed in the etching chamber 9, and the etching is conducted in the same manner as in Example 1. Namely, an etching gas ($CCl_4$) and a source gas of GaAs ($TMGa+AsH_3$) are introduced in this order into the etching chamber 9, after which the irradiation of the laser beam from the solid-state tunable laser 37 is started. Finally, the gases in the etching chamber are discharged. The sample is kept at a temperature of 300 $\Delta K$.

Figure 8B:
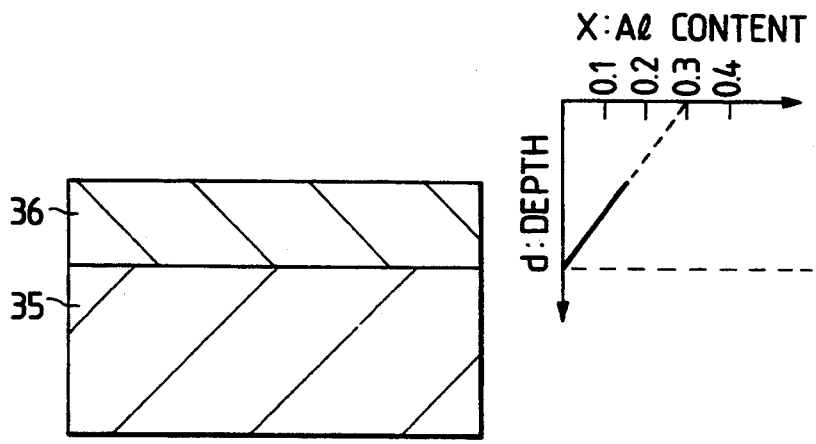

The surface of the sample 11 etched in this Example is examined by the Auger electron spectroscopy. As a result, 1 to 3 atomic layers on the surface become GaAs, and the layer of the $Al_{0.15}Ga_{0.85}As$ is defected underneath the atomic layers of GaAs. Namely, as shown in FIG. 8b, when the etching is progressed by the RIE and the portion having the composition of x=0.15 is exposed on the surface, the photo-CVD reaction of the GaAs is induced and is competed with the etching reaction, as a result of which the etching reaction at the portion is stopped. The GaAs film on the etched surface is very thin, which can be simply removed by dry etching or wet etching. In addition, the source gas for CVD may be added with a $TMAI(Al(CH_3)_3$:trimethylealuminum) as a source gas of aluminum. In this case, the partial pressures of the TMGa and TMAl are respectively adjusted such that the composition (x) of the $Al_xGa_{1-x}As$ layer formed by the photo-CVD reaction becomes 0.15.

The photo-CVD reaction has been used in this Example; however, as shown in the next Example 7, by using the etching equipment improving that as shown in FIG. 4 wherein the Ar ion laser 16 is replaced into the solid-state tunable laser 37, and the substrate holder 16 includes a heater and cooling mechanism, the present invention utilizing the photo-oxidation reaction can be applicable.

<Example 7>

Figure 10:
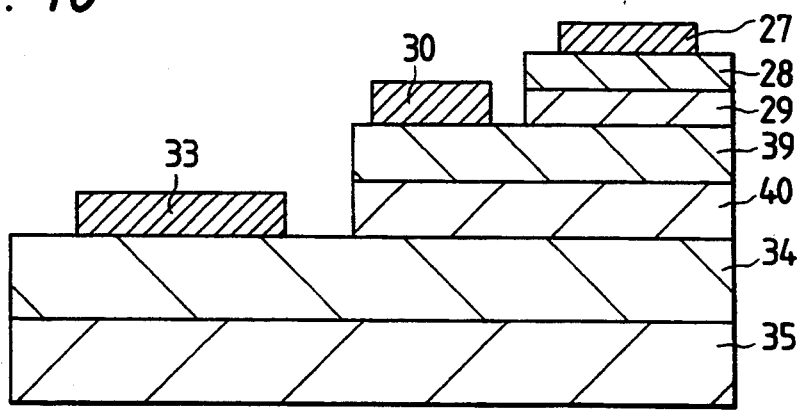
FIG. 10 is a view showing Example 7 of the present invention.

In this Example, Example 6 is further developed and the present invention is applicable for fabrication of a HBT having a graded composition base layer. FIG. 10 shows a structure of the HBT having the graded composition base layer. In the base layer having the graded composition, an electric field is generated in a base region, which accelerates an electron, that is, shortens the base traveling time of the electron thus improving the RF characteristic. In a sample used in this Example, the composition of a p+-$Al_xGa_{1-x}As$ (graded composition base) layer 39 is as follows: x=0.1 at the interface with n-$Al_xGa_{1-x}As$ (emitter) layer 29; and x=0.0 at the interface with u-GaAs (collector) layer 40. In the usual fabricating process of the HBT, for obtaining the certain ohmic contact of a base electrode 30 having a three-layer structure of Ti/Pt/Au, it is desired to slightly etch the p+-$Al_xGa_{1-x}As$ (graded composition base) layer 39. This etching serves to make thinner the base layer thereby exerting a large effect on the characteristic of the HBT as mentioned in Example 5. In order to control the etching quantity, there is used a manner as shown in Example 6 capable of stopping the etching at the specified composition.

In this Example, as mentioned in the last of Example 6, there is used the etching equipment improving that as shown in FIG. 4. The oscillating wavelength of the solid-state tunable laser 37 is adjusted to be 813 nm for stopping the etching at the composition of x=0.08. This wavelength corresponds to the direct transition band gap energy of the $Al_xGa_{1-x}As$ at X=0.08, that is, 1.53 ΔV.

After each layer having the graded composition base layer is formed using the ultra-high vacuum MBE equipment, a resist mask is formed on an emitter area by lithography. Then, a n+-GaAs (cap) layer 28 is selectively etched by an usual RIE equipment using an etching gas of $CCl_2F_2$ so as to expose the surface of a n-$Al_xGa_{1-x}As$ (emitter) layer 29. Subsequently, the wafer is set in an etching chamber 9 of the etching equipment improving that as shown in FIG. 4, and the selective etching of the present invention utilizing the photo-oxidation reaction is conducted. The selective etching is conducted in the same manner as in Example 2, except that the Ar ion laser 16 is replaced to the solid-state tunable laser 37. Since the light for exciting the surface photo-oxidation is not absorbed by the n-$Al_xGa_{1-x}As$ having the composition of x<0.08, the etching is not stopped at the interface between the n-$Al_xGa_{1-x}As$ (emitter) layer 29 and the p+-$Al_xGa_{1-x}As$ (graded composition base) layer 39, and is progressed up to the depth corresponding to the composition of x=0.08, and thereat the photo-oxidation reaction is started and thereby the etching is stopped. In this Example, after etching, the thin oxide of Ga remaining on the surface is removed by wet etching.

After that, in the same manner as in Example 5, the wafer is taken out of the etching chamber 9 and is then formed with a resist mask such that a sub-collector region is exposed. Subsequently, the p+-$Al_xGa_{1-x}As$ (graded composition base) layer 39 and a u-GaAs (collector) layer 40 are respectively etched by the RIE using the etching gas of $CCl_4$. Finally, an emitter electrode 27, base electrode 30 and collector electrode 33 are formed by a known lithography method.

The HBT having the graded composition formed in this Example has the maximum oscillating frequency of approximately 80 GHz, with little scattering of thereof.

In addition, in the case that a metal acting as a p-type impurity to a III-V group compound semiconductor such as Zn, Mg and Be is used as a base electrode, there can be obtained a preferable ohmic contact even in the state that the emitter layer remains by a specified layer thickness or less. In this case, the remaining thickness of the emitter layer is required to be controlled, and accordingly, the composition (x) of the n-$Al_xGa_{1-x}As$ (emitter) layer 29 on the base layer side is gradually graded for stopping the etching at the specified composition, that is, at the specified layer thickness. In such a case, the present invention is applicable as it is.

<Example 8>

In this Example, the present invention is applied for checking the thickness of $Al_xGa_{1-x}As$ crystal growth film. The most simple method for measuring the thickness of the crystal growth film is to partially etch the crystal growth film and measure the height of the step by a stylus thickness meter. A plurality of points on the wafer can be measured for a short time by this method. Consequently, this method is suitable for checking the thickness distribution. Since the etching of only the GaAs layer is possible by the conventional dry etching, the thickness of the GaAs film formed on the $Al_xGa_{1-x}As$ is measured by the above method. In this Example, the $Al_xGa_{1-x}As$ film can be selectively etched, which makes it possible to measure the thickness distribution of the $Al_xGa_{1-x}As$ film formed on the GaAs wafer, in contrast with the conventional one.

Figure 11A:
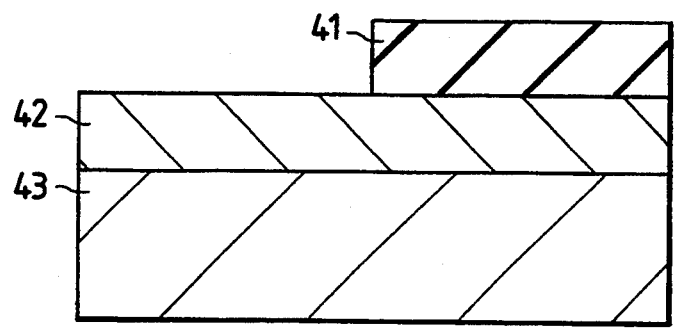
FIGS. 11a and 11c are views showing Example 8 of the present invention.
Figure 11B:
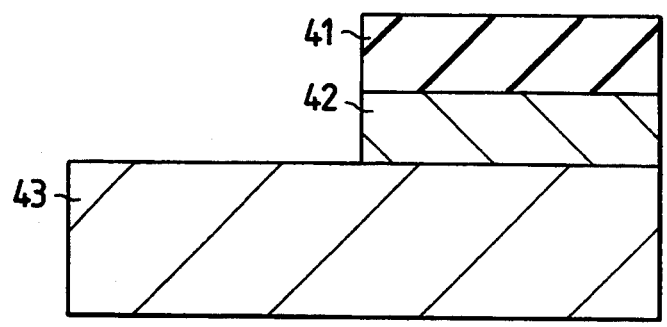
Figure 11C:
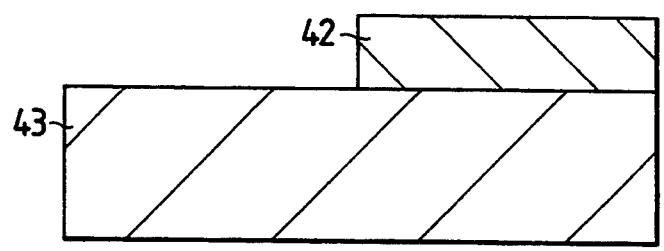

FIGS. 11a to 11c show a method for measuring the thickness distribution according to this Example. At first, as shown in FIG. 11a, a resist mask 41 is formed on a sample obtained by growing an $Al_xGa_{1-x}As$ film 42 on a GaAs wafer 43. Subsequently, as shown in FIG. 1b, only the exposed portion of the $Al_xGa_{1-x}As$ film 42 is etched. Then, the resist mask 41 is removed for revealing the step as shown in FIG. 11. The step height is measured by the stylus thickness meter, resulting in the obtained thickness distribution.

<Example 9>

In this Example, the present invention utilizing the photo-CVD reaction is applied for the fabrication process of HIGFET (Heterostructure Insulated Gate Field Effect Transistor).

Figure 12A:
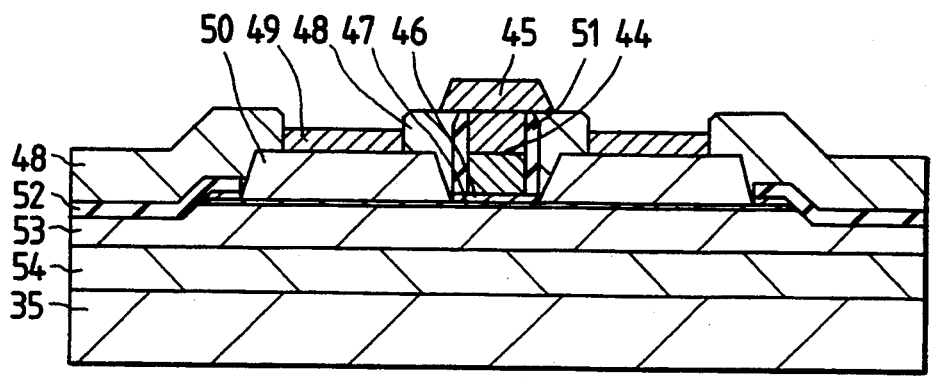
FIGS. 12a and 12c are views showing Example 9 of the present invention.

FIG. 12 shows a sectional structure of the HIGFET having such a feature that a Schottky junction formed between a W/WSi gate 44 and a u-$Al_{0.3}Ga0.7As$ 46 artificially serves as an insulating film. The fabricating procedure of the HIGFET is as follows: a GaAs (buffer) layer 54, p-GaAs layer 53, n-GaAs (channel) layer 47 and u-$Al_{0.3}Ga_{0.7}As$ 46 are formed on a semi-insulated GaAs substrate 35 by epitaxial growth. The film of each layer and the impurity concentration are shown in Table 2.

TABLE 2

| No. | | Film thickness [nm] | Impurity Concentration [/cm$^3$] |
|---|---|---|---|
| 46 | u-GaAs layer | 20–30 | — |
| 47 | n-GaAs (channel) layer | 10–20 | 1.5–5.0 E18 |
| 53 | P-GaAs layer | 200–400 | 1.0–4.0 E16 |
| 54 | GaAs (buffer) layer | 200–400 | — |
| 35 | Semi-insutated GaAs substrate | — | — |

Figure 12B:
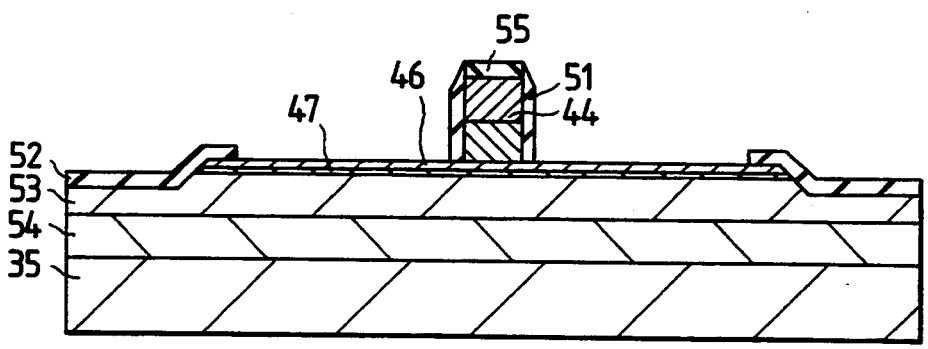

Next, the mesa-etching is conducted on the way of the p-GaAs layer 53. Thereat, there is formed the W/WSi gate 44. Subsequently, there are formed a $SiO_2$ pattern 52 and a gate electrode side wall $SiO_2$ film 51. This is shown in FIG. 12b. After masking of the $SiO_2$ pattern 52 and the gate electrode side wall $SiO_2$ film 51, the exposed portion of the u-$Al_{0.3}Ga_{0.7}As$ layer 46 is etched. In this Example, the present invention is applied for the etching of the u-$Al_{0.3}Ga_{0.7}As$ layer 46. After that, using MOCVD, a n+-GaAs layer 50 is selectively grown, and the source electrode/drain electrode 49 are respectively formed by a known lift-off method, to thus obtain the HIGFET.

When the u-$Al_{0.3}Ga_{0.7}As$ layer 46 is etched by the RIE using $CCl_4$, the etching is not stopped at the surface of the GaAs (channel) layer under the u-$Al_{0.3}Ga_{0.7}As$ layer 46, thus causing the over-etching. The over-etching is essential to perfectly remove the u-$Al_{0.3}Ga_{0.7}As$ layer 46. However, by the over-etching, the n-GaAs layer (channel) layer 47 is made thinner, and thus the source resistance and drain resistance are increased, which deteriorates the characteristic of the HIGFET. According to the present invention, only the u-$Al_{0.3}Ga_{0.7}As$ layer 46 is etched, and therefore, there little occurs the over-etching thereby eliminating a fear of causing such a trouble.

Figure 12C:
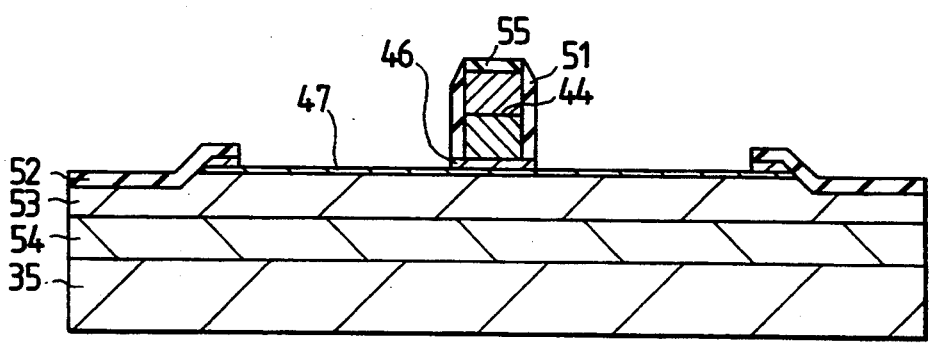

At first, the wafer after completing the processes as shown in FIG. 12b is placed in an etching chamber 9 of the etching equipment as shown in FIG. 9. The oscillating wavelength of the solid-state tunable laser 37 is adjusted to be 800 nm. The light having such a wavelength is not absorbed by the u-Al$_{0.3}$Ga$_{0.7}$As layer 46 but by only the n-GaAs layer (channel) layer 47. The etching is conducted in the same procedure as in Example 1, except that in completing the selective etching, the laser beam irradiation from the solid-state tunable laser 37 and the supply of TMGa and AsH$_3$ are previously stopped and the usual RIE is conducted for 5 min. Thus, the thin GaAs film formed on the whole surface, for example, on the SiO$_2$ pattern 52 is removed by discharge in a vapor phase. Consequently, as shown in FIG. 12c, only the u-Al$_{0.3}$Ga$_{0.7}$As layer 46 is selectively etched.

After that, a n$^+$-GaAs layer 50 is re-grown by the MOCVD using a source gas of (TMGa+AsH$_3$) and a doping gas of Si$_2$H$_6$, and finally the source electrode/drain electrode 49 are respectively formed by the lift-off method, to thus obtain the HIFET.

In the HIFET thus obtained, the source resistance is 0.5 Ω.mm, which is significantly improved as compared with the conventional value of 0.7 Ω.mm.

<Example 10>

In this Example, the present invention is applied for a recessed gate HEMT (High Electron Mobility Transistor).

FIG. 13 shows a sectional structure of the HEMT. The thickness of each layer and the impurity concentration are shown in Table 3.

TABLE 3

| No. | | Film thickness [nm] | Impurity Concentration [/cm$^3$] |
|---|---|---|---|
| 28 | n$^+$-GaAs (cap) layer | 150–300 | — |
| 56 | u-Al$_{0.3}$Ga$_{0.7}$As (etching stop) layer | 1–2 | — |
| 57 | u-GaAs (cover) layer | 10–20 | — |
| 58 | u-Al$_{0.15}$Ga$_{0.85}$As layer | 10–30 | — |
| 59 | n-Al$_{0.15}$Ga$_{0.85}$As (carrier supply) layer | 10–50 | 1.0–7.0 E18 |
| 60 | u-Al$_{0.15}$Ga$_{0.85}$As (spacer) layer | 2–6 | — |
| 61 | u-In$_x$Ga$_{1-x}$As (channel) layer | 8–40 | — |
| 62 | u-GaAs (buffer) layer | 300–400 | — |
| 35 | semi-insulated GaAs substrate | — | — |

Figure 13A:
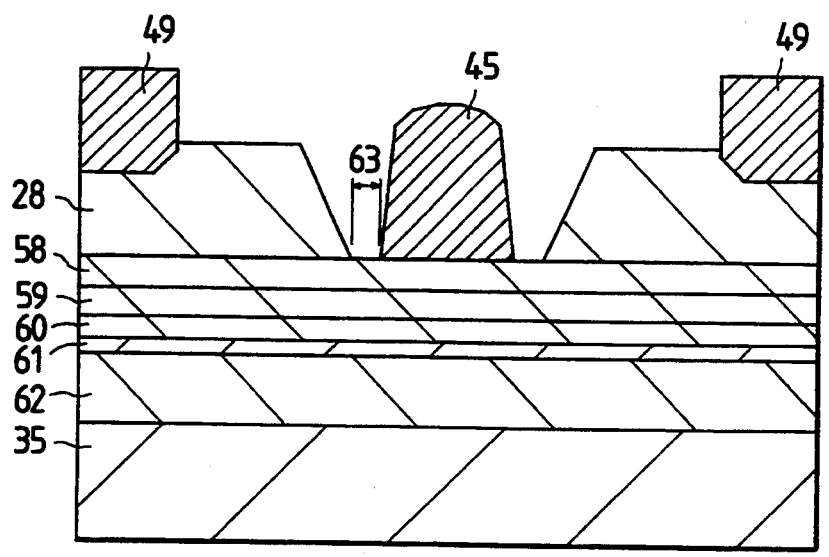
FIGS. 13a and 13b are views showing a method for fabricating a recessed gate HEMT of the present invention.
Figure 13B:
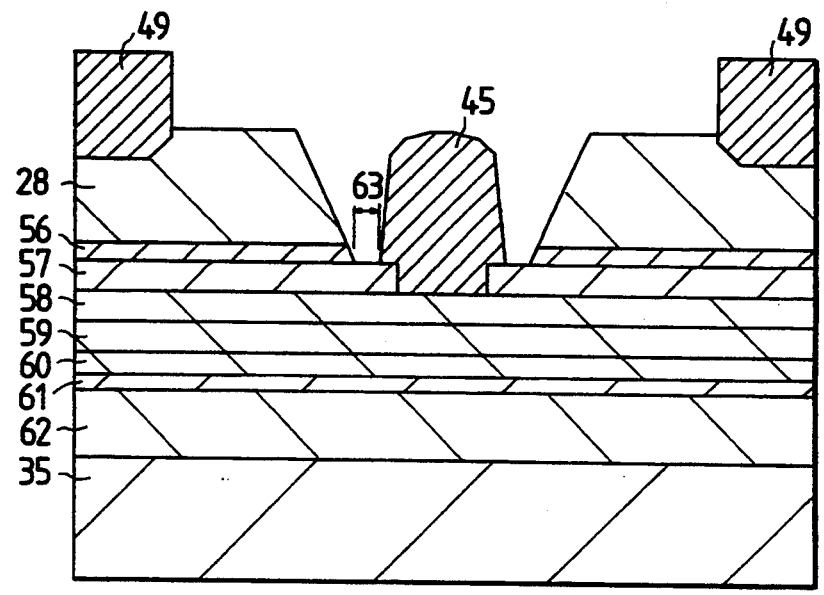

The structure of the usual HEMT is shown in FIG. 13a. The characteristic of the HEMT device is significantly affected by the resistance of the gap between the gate electrode 45 and the n$^+$-GaAs (cap) layer 28. The gap is required to secure the break-down resistance between the gate electrode 45 and the n$^+$-GaAs (cap) layer 28. While the dimension is contracted in the lateral direction in FIG. 13a, the distance of the above gap is usually 100–300 nm, and the depth from the gate electrode 45 to the channel layer is several ten nm. The source resistance is dependent on the concentration of the carriers remaining on the channel layer under the above gap portion 63. In particular, the n-Al$_{0.15}$Ga$_{0.85}$As (carrier supply) layer 59 is thinner, which exert a large effect on the device having a low threshold voltage. The recessed gate HEMT as shown in FIG. 13b provides the u-GaAs (cover) layer 57 for increasing the carrier concentration. Since the u-GaAs (cover) layer 57 lowers the conduction band energy of the whole heterostructure under the u-GaAs (cover) layer 57, the concentration of the carriers remaining in the u-In$_x$Ga$_{1-x}$As (channel) layer 61 is increased, the resistance of the above gap portion is reduced, and the source resistance is reduced. As a result, a mutual conductance gm is enhanced, which makes it possible to improve the characteristics of the device such as a cutoff frequency $f_t$, maximum oscillating frequency $f_{max}$ and noise factor NF.

Figure 14A:
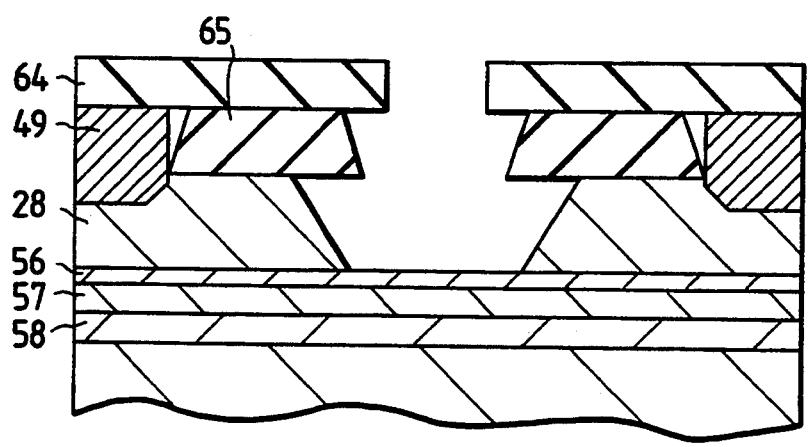
FIGS. 14a and 14c are views showing Example 10 of the present invention.
Figure 14B:
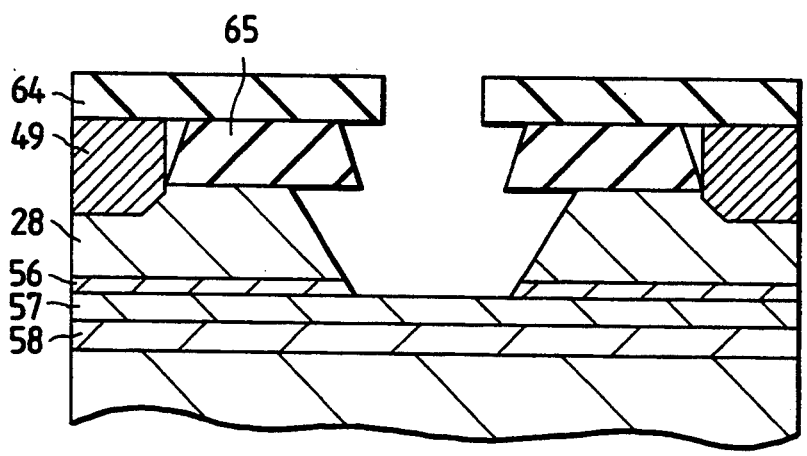
Figure 14C:
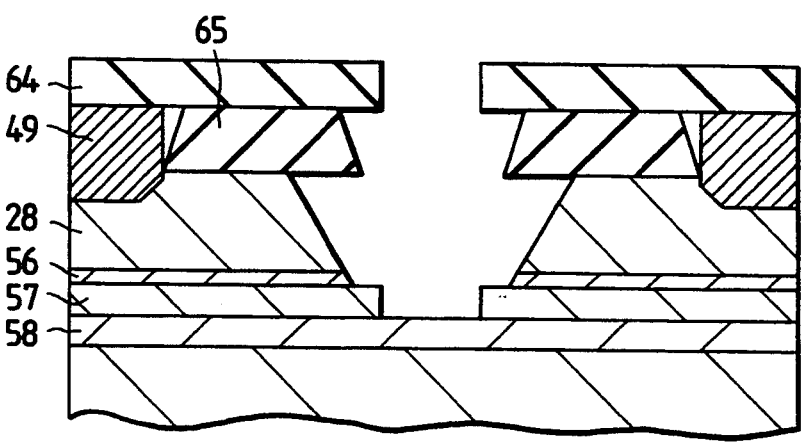
Figure 15:
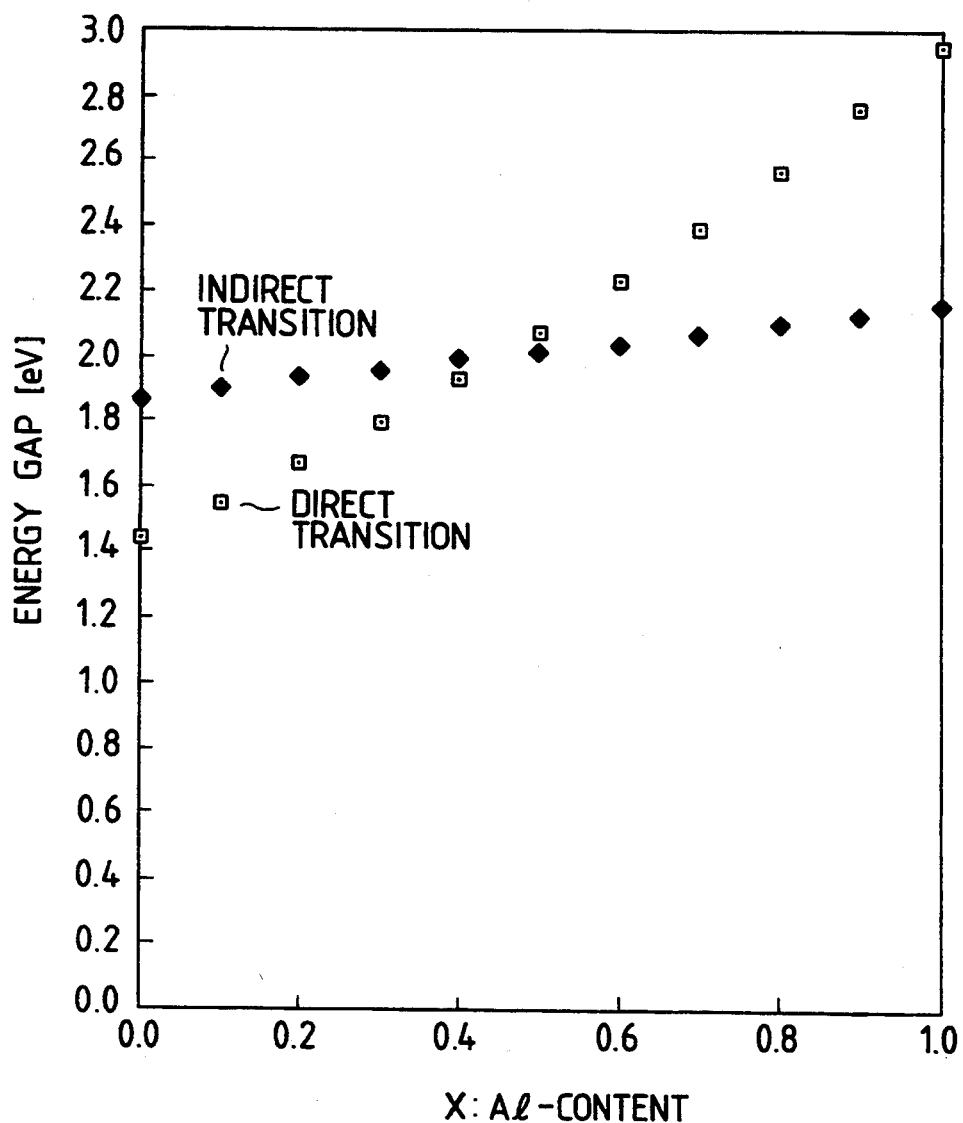
FIG. 15 is a graph showing a relationship between the band gap energy and the composition.

The gate portion of the recessed gate HEMT is usually fabricated in the procedure as shown in FIGS. 14a to 14c. At first, a SiO$_2$ film 65 is wet etched using a resist pattern 64 for forming the gate as a mask, and the n$^+$GaAs film 28 being a cap layer is selectively etched by the RIE. At this time, the u-Al$_{0.3}$Ga$_{0.7}$As layer 56 serves to stop the etching. In this etching, since there slightly occurs the side etching, the over-etching is conducted, and consequently the etching is progressed in the lateral direction. Thus, as shown in FIG. 14a, there is formed the above gap portion between the n$^+$-GaAs layer 28 and the gate electrode. Next, by wet etching, the u-Al$_{0.3}$Ga$_{0.7}$As layer 56 is selectively etched. The above state is shown in FIG. 14b. The selective etching is seemed to be very important. The reason for this is that the u-GaAs (cover) layer 57 is over-etched to be thinned, and the concentration of the carriers remaining in the channel is reduced, which increases the resistance of the above gap portion. Finally, using the resist pattern 64 for forming the gate as a mask, the u-GaAs (cover) layer 57 is selectively etched by the RIE, to thus obtain the recessed gate portion.

In this Example, the present invention has been applied for etching the u-Al$_{0.3}$Ga$_{0.7}$As (etching stop) layer 56. The etching is conducted using the etching equipment as shown in FIG. 9. The wavelength of the solid-state tunable laser is adjusted to be 800 nm. The wafer completing the wet etching of the SiO$_2$ film 65 is set in the etching chamber 9, and the n$^+$-GaAs (cap) layer 28 is selectively etched by the RIE using the etching gas of CCl$_2$F$_2$. Subsequently, the etching gas changed into CCl$_4$ and also a source gas of (TMGa+AsH$_3$) for forming GaAs are introduced, and the u-Al$_{0.3}$Ga$_{0.7}$As (cover) layer 56 is selectively etched using the photo-CVD reaction of the present invention. Finally, the etching gas is changed into CCl$_2$F$_2$ again, and the u-GaAs (cover) layer 58 is selectively etched.

In the conventional process, the etchings are conducted in the different manners: the n$^+$-GaAs (cap) layer 28, RIE; u-Al$_{0.3}$Ga$_{0.7}$As (cover) layer 56, wet etching; and u-GaAs (cover) layer 57, RIE. However, using the present invention, the recessed gate structure can be fabricated in one etching equipment by changing the gases.

As mentioned above, according to the present invention, it is possible to selectively etch the indirect transition material to the direct transition material among the materials having the different types of band gap energies. Also, among the direct semiconductors, the semiconductor having a wide band gap energy can be selectively etched.

What is claimed is:

1. A method for dry etching an article to be etched including a plurality of regions different from each other in photo-absorption of a light having a specific wavelength using an etching gas, comprising the step of:

irradiating a light having said wavelength on said article to be etched for reducing an etching rate of a first region having a large photo-absorption coefficient to said light, thereby selectively etching a second region having a photo-absorption coefficient to said light smaller than that of said first region.

2. A dry etching method according to claim 1, wherein said etching is conducted while irradiating a light having said wavelength.

3. A dry etching method according to claim 1, wherein a plurality of said regions are distributed on said sample.

4. A dry etching method according to claim 1, wherein a plurality of said regions are distributed in the depth direction of said sample, and the photo-absorption coefficient of a region formed at a deep portion of said sample is larger than that formed at a shallow portion of said sample.

5. A dry etching method according to claim 1, wherein said first region comprises GaAs, and said second region comprises $Al_xGa_{1-x}As$.

6. A dry etching method according to claim 5, an oxide of Ga is formed on the surface of said GaAs for obstructing the etching of said GaAs.

7. A dry etching according to claim 5, wherein said light includes an ultra-violet light having a wavelength of 185 nm and 254 nm.

8. A dry etching method according to claim 5, wherein said etching is conducted at the same time when said GaAs is deposited.

9. A dry etching according to claim 8, wherein said etching is conducted using $CCl_4$, and said GaAs film is formed using $Ga(CH_3)_3$ and $AsH_3$.

10. A dry etching method according to claim 1, wherein said etching is conducted using a hot molecular beam.

11. A dry etching method according to claim 1, wherein a film is formed on said first region for obstructing the etching of said first region.

12. A dry etching method according to claim 11, wherein said film is an oxide film.

13. A dry etching method according to claim 12, wherein said film is formed by oxidizing a surface of said first region.

14. A dry etching method according to claim 13, wherein said film is formed in an atmosphere containing oxygen by irradiating said light on said article to be etched.

15. A dry etching method according to claim 14, wherein said film is formed by introducing said etching gas and oxygen gas in a reaction chamber.

16. A dry etching method according to claim 11, wherein said film is formed by using chemical vapor deposition technique.

17. A dry etching method according to claim 11, wherein said first region is a GaAs region.

18. A dry etching method according to claim 11, wherein said second region is a $Al_xGa_{1-x}As$ region.

19. A method for dry etching an article to be etched including a plurality of regions different from each other in photo-absorption of a light having a specific wavelength using an etching gas, comprising the step of:

irradiating a light having said wavelength on said article to be etched for reducing an etching rate of a first region having a large photo-absorption to said light by stimulating said etching gas absorbed on a surface of said first region, thereby selectively etching a second region having a photo-absorption to said light smaller than that of said first region.

20. A method for dry etching according to claim 19, wherein said light is emitted from a low pressure mercury lamp and said etching gas is $Cl_2$.

* * * * *

UNITED STATES PATENT AND TRADEMARK OFFICE
CERTIFICATE OF CORRECTION

PATENT NO. : 5,401,357
DATED : March 28, 1995
INVENTOR(S) : Okuhira et al.

It is certified that error appears in the above-indentified patent and that said Letters Patent is hereby corrected as shown below:

In the Claims:

Column 15
Claim 6, line 27 after "claim 5, insert -- wherein --.
Claim 7, line 33 after "etching" insert -- method --.
Claim 7, line 34 before " of " insert -- in a range --.

Signed and Sealed this

Twenty-sixth Day of September, 1995

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,401,357

DATED : March 28, 1995

INVENTOR(S) : Hidekazu Okuhira et al.

It is certified that error appears in the above-identified patent and that said Letters Patent is hereby corrected as shown below:

Column 1, line 24, change "(Hetero-Bipolar)" to --(Hetero-Bipolar--.

Column 1, line 53, change "irridating" to --irradiating--.

Column 3, line 34, change "GaAs 1" to --GaAs 2--.

Column 5, line 16, Delete "the" (second occurrence).

Column 12, Table 2, Change "Semi-insutated" to --Semi-insulated--.

Column 13, Table 3, No. 56 Change "AS" to --As--.
Column 13, Table 3, No. 58 Change "AS" to --As--.
Column 13, Table 3, No. 59 Change "AS" to --As--.
Column 13, Table 3, No. 60 Change "AS" to --As--.

UNITED STATES PATENT AND TRADEMARK OFFICE
CERTIFICATE OF CORRECTION

PATENT NO. : 5,401,357

DATED : March 28, 1995

INVENTOR(S) : Hidekazu Okuhira et al.

It is certified that error appears in the above-identified patent and that said Letters Patent is hereby corrected as shown below:

Column 15, line 28, After "claim 5," insert --wherein--.
          line 31, After "etching" insert --method--.
          line 34, Before "of" insert --in a range--.
          line 39, After "etching" insert --method--.

Signed and Sealed this

Twenty-second Day of October, 1996

Attest:

BRUCE LEHMAN

*Attesting Officer*      *Commissioner of Patents and Trademarks*